(12) United States Patent
Shoham et al.

(10) Patent No.: US 7,290,083 B2
(45) Date of Patent: Oct. 30, 2007

(54) ERROR PROTECTION FOR LOOKUP OPERATIONS IN CONTENT-ADDRESSABLE MEMORY ENTRIES

(75) Inventors: Doron Shoham, Shoham (IL); Shimon Listman, Tel Mond (IL); Eliahu Shapiro, Katzir (IL)

(73) Assignee: Cisco Technology, Inc., San Jose, CA (US)

( * ) Notice: Subject to any disclaimer, the term of this patent is extended or adjusted under 35 U.S.C. 154(b) by 441 days.

(21) Appl. No.: 10/879,254

(22) Filed: Jun. 29, 2004

(65) Prior Publication Data

US 2005/0289295 A1    Dec. 29, 2005

(51) Int. Cl.
G06F 12/00  (2006.01)

(52) U.S. Cl. .................. 711/108; 711/118; 711/221; 365/49; 709/245; 370/392

(58) Field of Classification Search ............... 711/108, 711/118, 221; 365/49; 370/392; 709/245
See application file for complete search history.

(56) References Cited

U.S. PATENT DOCUMENTS

| | | | |
|---|---|---|---|
| 3,648,254 A | 3/1972 | Beausoleil | |
| 4,168,486 A | 9/1979 | Legory | |
| 4,296,475 A | 10/1981 | Nederlof et al. | |
| 4,692,922 A | 9/1987 | Kiriu et al. | |
| 4,740,968 A | 4/1988 | Aichelmann, Jr. | |
| 4,791,606 A | 12/1988 | Threewitt et al. | |
| 4,852,100 A | 7/1989 | Christensen et al. | |
| 4,996,666 A | 2/1991 | Duluk, Jr. | |
| 5,313,475 A | 5/1994 | Cromer et al. | |
| 5,379,304 A | 1/1995 | Dell et al. | |
| 5,383,146 A | 1/1995 | Threewitt | |
| 5,440,715 A | 8/1995 | Wyland | |
| 5,450,351 A | 9/1995 | Heddes | |
| 5,841,874 A | 11/1998 | Kempke et al. | |
| 5,842,040 A | 11/1998 | Hughes et al. | |
| 5,845,324 A | 12/1998 | White et al. | |
| 5,978,885 A | 11/1999 | Clark, II | |
| 6,041,389 A | 3/2000 | Rao | |
| 6,047,369 A | 4/2000 | Colwell et al. | |
| 6,069,573 A | 5/2000 | Clark, II et al. | |

(Continued)

OTHER PUBLICATIONS

Lo, "Fault-Tolerant Content Addressable Memory," p. 193-196, IEEE, 1993.*

(Continued)

*Primary Examiner*—Stephen C. Elmore
(74) *Attorney, Agent, or Firm*—The Law Office of Kirk D. Williams

(57) ABSTRACT

Error protection for lookup operations in a content-addressable memory (CAM) entries is disclosed. Values extended to include error protection or error protection fields are stored in CAM entries and a lookup operation is performed on a similarly extended lookup word to determine whether or not an entry is matched, that is, if all or all but some predetermined number of bits match one of the extended entries. For example, one implementation includes multiple CAM entries and logic configured to perform a lookup operation in parallel on each of the CAM entries based on a lookup word to determine whether or not a hit results, where the hit is determined if an entry matches the lookup word in all or all but k bit positions, where n and k are integers, n>k, and k>0.

30 Claims, 12 Drawing Sheets

U.S. PATENT DOCUMENTS

| | | | |
|---|---|---|---|
| 6,081,440 | A | 6/2000 | Washburn et al. |
| 6,134,135 | A | 10/2000 | Andersson |
| 6,137,707 | A | 10/2000 | Srinivasan et al. |
| 6,154,384 | A | 11/2000 | Nataraj et al. |
| 6,175,513 | B1 | 1/2001 | Khanna |
| 6,181,698 | B1 | 1/2001 | Hariguchi |
| 6,199,140 | B1 | 3/2001 | Srinivasan et al. |
| 6,240,003 | B1 | 5/2001 | McElroy |
| 6,246,601 | B1 | 6/2001 | Pereira |
| 6,295,576 | B1 | 9/2001 | Ogura et al. |
| 6,307,855 | B1 | 10/2001 | Hariguchi |
| 6,374,326 | B1 | 4/2002 | Kansal et al. |
| 6,377,577 | B1 | 4/2002 | Bechtolsheim et al. |
| 6,385,071 | B1 | 5/2002 | Chai et al. |
| 6,389,506 | B1 | 5/2002 | Ross et al. |
| 6,467,019 | B1 | 10/2002 | Washburn |
| 6,510,509 | B1 | 1/2003 | Chopra et al. |
| 6,526,474 | B1 | 2/2003 | Ross |
| 6,535,951 | B1 | 3/2003 | Ross |
| 6,597,595 | B1 | 7/2003 | Ichiriu et al. |
| 6,606,681 | B1 | 8/2003 | Uzun |
| 6,618,281 | B1 | 9/2003 | Gordon |
| 6,643,260 | B1 | 11/2003 | Kloth et al. |
| 6,651,096 | B1 | 11/2003 | Gai et al. |
| 6,658,002 | B1 | 12/2003 | Ross et al. |
| 6,658,458 | B1 | 12/2003 | Gai et al. |
| 6,678,786 | B2 | 1/2004 | Srinivasan et al. |
| 6,687,144 | B2 | 2/2004 | Batson et al. |
| 6,715,029 | B1 | 3/2004 | Trainin et al. |
| 6,717,946 | B1 | 4/2004 | Hariguchi et al. |
| 6,725,326 | B1 | 4/2004 | Patra et al. |
| 6,728,124 | B1 | 4/2004 | Ichiriu et al. |
| 6,732,227 | B1 | 5/2004 | Baumann |
| 6,738,862 | B1 | 5/2004 | Ross et al. |
| 6,775,737 | B1 | 8/2004 | Warkhede et al. |
| 6,862,281 | B1 | 3/2005 | Chandrasekaran |
| 6,871,262 | B1 | 3/2005 | Oren et al. |
| 6,871,265 | B1 | 3/2005 | Oren et al. |
| 6,961,808 | B1 | 11/2005 | Oren et al. |
| 6,970,971 | B1 | 11/2005 | Warkhede et al. |
| 2003/0005146 | A1 | 1/2003 | Miller et al. |
| 2003/0231631 | A1 | 12/2003 | Pullela |
| 2004/0015752 | A1 | 1/2004 | Patella et al. |
| 2004/0015753 | A1 | 1/2004 | Patella et al. |
| 2004/0030802 | A1 | 2/2004 | Eatherton et al. |
| 2004/0030803 | A1 | 2/2004 | Eatherton et al. |
| 2004/0100950 | A1 | 5/2004 | Basu et al. |
| 2004/0170171 | A1 | 9/2004 | Kanekar et al. |
| 2004/0170172 | A1 | 9/2004 | Puella et al. |
| 2004/0172346 | A1 | 9/2004 | Kanekar et al. |
| 2005/0010612 | A1 | 1/2005 | Enderwick et al. |
| 2005/0114602 | A1 | 5/2005 | Ngai et al. |
| 2005/0157712 | A1 | 7/2005 | Rangaranjan et al. |

OTHER PUBLICATIONS

U.S. Appl. No. 09/910,227, filed Jul. 20, 2001, Ross.
U.S. Appl. No. 10/813,210, filed Mar. 29, 2004, Nagaraj.
U.S. Appl. No. 11/040,678, filed Jan. 22, 2005, Trainin.
"Soft Error in TCAMs: Causes and Cures," Sibercore Technologies, Jul. 2003, Kanata, ON, Canada.
"Technical Description of Turbo Product Codes," Version 4.0, Jun. 1999, Efficient Channel Coding, Inc., Orange, Ohio, USA.
U.S. Appl. No. 11/252,960, filed Oct. 18, 2005, Krishnan et al.
Mcauley et al., "Fast Table Lookup Using CAMs," Networking: Foundation for the Future, IEEE, vol. 3, pp. 1382-1391, Mar. 28-Apr. 1, 1993.
Andrew S. Tanenbaum, Computer Networks, Prentice-Hall, 1981, pp. 125-132.

\* cited by examiner

ERROR PROTECTION FOR LOOKUP OPERATIONS IN CONTENT-ADDRESSABLE MEMORY ENTRIES

TECHNICAL FIELD

One embodiment of the invention relates to communications and computer systems, especially networked routers, packet switching systems, and other devices; and more particularly, one embodiment relates to error protection for lookup operations in content-addressable memory entries; and more particularly, one embodiment stores values extended to include error-protection or error-protection fields and determines a match to a similarly extended lookup word if all or all but some predetermined number of bits match one of the extended entries.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP). Note, nothing described or referenced in this document is admitted as prior art to this application unless explicitly so stated.

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Packet classification as required for, inter alia, access control lists (ACLs) and forwarding decisions, is a demanding part of switch and router design. The packet classification of a received packet is increasingly becoming more difficult due to ever increasing packet rates and number of packet classifications. For example, ACLs require matching packets on a subset of fields of the packet flow label, with the semantics of a sequential search through the ACL rules. IP forwarding requires a longest prefix match.

Known approaches of packet classification include using custom application-specific integrated circuits (ASICs), custom circuitry, software or firmware controlled processors, and associative memories, including, but not limited to binary content-addressable memories (binary CAMs) and ternary content-addressable memories (ternary CAMs or TCAMs). Each entry of a binary CAM typically includes a value for matching against, while each TCAM entry typically includes a value and a mask. The associative memory compares a lookup word against all of the entries in parallel, and typically generates an indication of the highest priority entry that matches the lookup word. An entry matches the lookup word in a binary CAM if the lookup word and the entry value are identical, while an entry matches the lookup word in a TCAM if the lookup word and the entry value are identical in the bits that are not indicated by the mask as being irrelevant to the comparison operations.

Associative memories are very useful in performing packet classification operations. As with most any system, errors can occur. For example, array parity errors can occur in certain content-addressable memories as a result of failure-in-time errors which are typical of semiconductor devices.

When a packet classification lookup operation is performed on an associative memory with corrupted entries, a bit error in an entry can result in a false hit, or a false miss. A false hit occurs when the corrupted value of an entry matches the lookup value when it otherwise would not match that entry (and thus another entry or no entry should have been match). A false miss occurs when an entry should have been matched except for the corruption in the entry. This could result in no entry being matched or another lower-priority entry being match. When these lookup operations are used for packet classification, an incorrect match or miss presents a problem especially when identifying a route or performing a security classification.

Error-correcting and error-detecting codes are well-known. For example, ANDREW S. TANENBAUM, COMPUTER NETWORKS, Prentice-Hall, 1981, pp. 125-132, discusses error-correcting and error-detecting codes, and is hereby incorporated by reference. Assume a codeword contains n bits of which m are data bits and r are error-correcting or error-detecting bits (e.g., redundant or check bits), with n=m+r. There are many well-known ways to generate the error-detecting and error-correcting bits. Given two codewords, it is possible to determine how many bits differ (e.g., by exclusively-OR'ing or one bit summing the corresponding bits of the two codewords and summing these results). The number of bit positions in which two codewords or a set of codewords differ is called the Hamming distance. A Hamming distance of d, means that it will require d single-bit errors to convert one codeword to another codeword. To detect j errors, a Hamming distance of j+1 is required because with such a code, there is no way that j single-bit errors can change a valid codeword into another valid codeword. Similarly, to correct j errors, a distance 2j+1 code because that way the legal codewords are so far apart that even with j changes, the original codeword is still closer than any other codeword, so it can be uniquely determined.

A prior approach protects the associative memory entries with error detection or correction values when the associative memory is not being used to perform a lookup operation. For example, using a background operation, the associative memory entries are periodically checked and corrected for errors (e.g., read from their location and if an error, the correct value is written back). Another prior approach is to periodically over write each associative memory entry with the correct value. These and other prior approaches do not immediately detect the error, nor detect the error when a lookup operation is performed on the corrupted entry. Thus, there can be significant periods (e.g., several seconds to minutes which can be a very long time in the context of a packet switch) before such corrupted entry is corrected.

Some random access memory (RAM) add error-correcting or error-detecting codes to each memory cell. As part of a read operation of a memory location, the data portion and the error-correcting or error-detecting code is read, which is then used to detect a possible error and/or correct a discovered error in the data portion. This is especially convenient to do as only one set of error-detecting/error correcting circuitry is required (i.e., to operate on the data read from the specified memory location). However, this approach is impractical for an associative memory, as each associative memory entry would need this complete circuitry, and the result of the error-corrected operation for each memory location would need to be compared to the lookup word for every lookup operation. Desired is a mechanism to reduce or eliminate the possible false hits or misses due to corrupted associative memory entries.

SUMMARY

Disclosed are, inter alia, methods, apparatus, data structures, computer-readable media, mechanisms, and means for providing error protection for lookup operations in content-addressable memory (CAM) entries. One embodiment stores values extended to include error-protection or error-protection fields and determines a match to a similarly extended lookup word if all or all but some predetermined number of bits match one of the extended entries.

One embodiment for identifying matching values in a content-addressable memory determines a set of extended values based on an original set of values, with each of the extended values including its original value and an error-correcting or error-detecting code generated based on the original value, such that each of the extended values are guaranteed to differ from each other by at least n bits. Content-addressable memory entries are programmed with the extended values. Lookup operations are then performed on the content-addressable memory entries based on a lookup word to determine whether or not a hit results, with a hit being determined if an entry matches the lookup word in all bit positions except for up to a maximum of k bit positions, wherein n and k are integers, n>k, and k>0.

One embodiment includes multiple content-addressable memory entries, and logic configured to perform lookup operations simultaneously and in parallel on the content-addressable memory entries based on a lookup word to determine whether or not a hit results, wherein the hit is determined if an entry of said content-addressable memory entries matches the lookup word in all bit positions except for up to a maximum of k bit positions, wherein n and k are integers, n>k, and k>0.

One embodiment identifies a position of the matching entry. In one embodiment, the lookup word includes an original lookup value and a lookup word error-correcting or error-detecting code generated based on the original lookup value. One embodiment identifies whether a determined hit is a full hit (all bits matched) or a partial hit (all but k bits matched). In one embodiment, k is less than or equal to the result of the integer division of (n/2) when n is an odd number and k is less than the result of the integer division of (n/2) when n is an even number. In one embodiment, in response to determining that there was a partial hit, a lookup operation is performed in a second data structure to verify the hit result. In one embodiment, in response to determining that there was a partial hit, the partially matching entry is updated to remove the any bit errors in the entry.

One embodiment for identifying matching values in a content-addressable memory determines a set of extended values based on an original set of values, with each of the extended values including its original value and an error-correcting or error-detecting code generated based on the original value, such that each of the extended values are guaranteed to differ from each other by at least three bits. Content-addressable memory entries are programmed with the extended values. Lookup operations are then performed on the content-addressable memory entries based on a lookup word to determine whether or not a hit results, with a hit being determined if an entry matches the lookup word in all or all but one bit positions. One embodiment also determines a hit if an entry matches the lookup word in all but two bit positions. One embodiment identifies a position of a matching entry. In one embodiment, the lookup word includes an original lookup value and a lookup word error-correcting or error-detecting code generated based on the original lookup value. One embodiment identifies whether a determined hit is a full hit or a partial hit. In one embodiment, in response to determining that there was a partial hit, a lookup operation is performed in a second data structure to verify the hit result. In one embodiment, in response to determining that there was a partial hit, the partially matching entry is updated to remove the any bit errors in the entry.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Figure 1A:
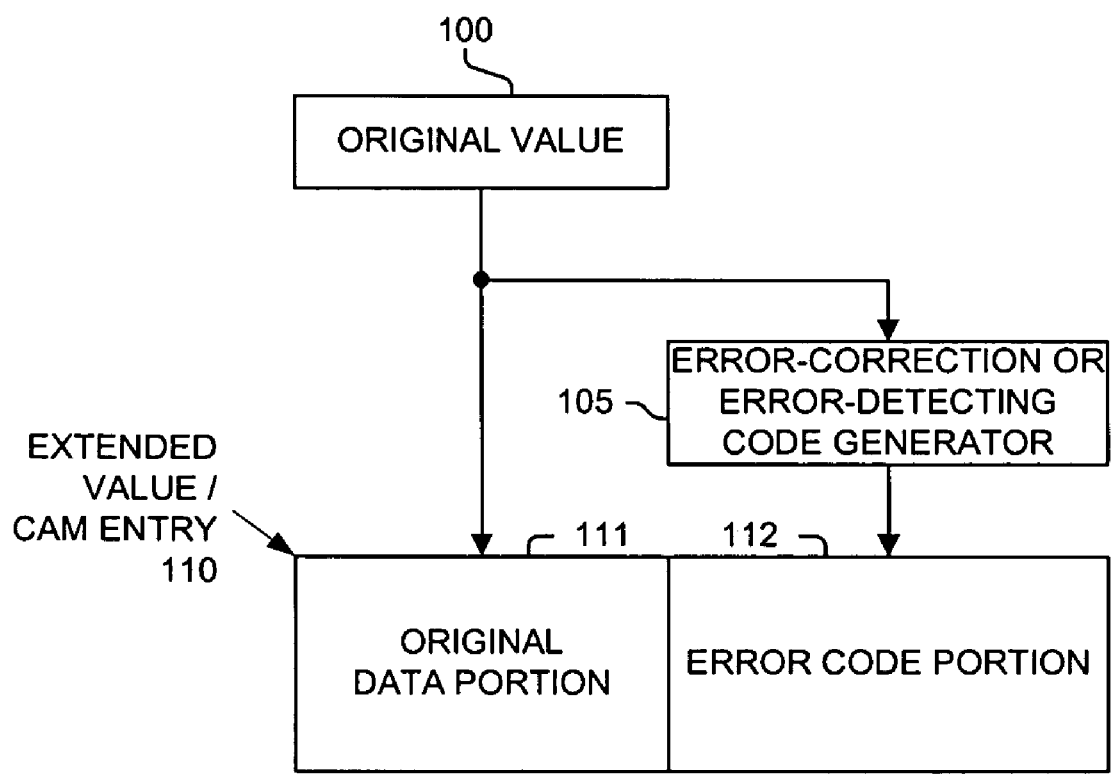
FIG. 1A is a block diagram illustrating the generating of extended values/CAM entries including its original value and an error-correcting or error-detecting code generated based on the original value performed in one embodiment.

Disclosed are, inter alia, methods, apparatus, data structures, computer-readable media, mechanisms, and means for providing error protection for lookup operations in content-addressable memory entries. One embodiment stores values extended to include error-protection or error-protection fields and determines a match to a similarly extended lookup word if all or all but some predetermined number of bits match one of the extended entries.

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations. Note, computer-readable media and means for performing methods and processing block operations are disclosed and are in keeping with the extensible scope and spirit of the invention.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or direct or indirect identification of a packet or information associated therewith. For example, often times a router operates on one or more fields of a packet, especially the header, so the body of the packet is often stored in a separate memory while the packet header is manipulated, and based on the results of the processing of the packet (i.e., the packet header in this example), the entire packet is forwarded or dropped, etc. Additionally, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process the value—the value must be obtained prior to processing it, although some of the associated processing may be performed prior to, concurrently with, and/or after the read operation). Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications media or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, storage mechanism, and other storage and signaling mechanisms including interfaces and devices such as network interface cards and buffers therein, as well as any communications devices and signals received and transmitted, and other current and evolving technologies that a computerized system can interpret, receive, and/or transmit. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory", etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. The term "subset" is used to indicate a group of all or less than all of the elements of a set. The term "subtree" is used to indicate all or less than all of a tree. Moreover, the term "or" is used herein to identify a selection of one or more, including all, of the conjunctive items.

Disclosed are, inter alia, methods, apparatus, data structures, computer-readable media, mechanisms, and means for providing error protection for lookup operations in content-addressable memory (CAM) entries. One embodiment stores values extended to include error-protection or error-protection fields and determines a match to a similarly extended lookup word if all or all but some predetermined number of bits match one of the extended entries.

One embodiment for identifying matching values in a content-addressable memory determines a set of extended values based on an original set of values, with each of the extended values including its original value and an error-correcting or error-detecting code generated based on the original value, such that each of the extended values are guaranteed to differ from each other by at least n bits. Content-addressable memory entries are programmed with the extended values. Lookup operations are then performed on the content-addressable memory entries based on a lookup word to determine whether or not a hit results, with a hit being determined if an entry matches the lookup word in all or all but k bit positions, wherein n and k are integers, n>k, and k>0.

One embodiment includes multiple content-addressable memory entries, and logic configured to perform lookup operations simultaneously and in parallel on the content-addressable memory entries based on a lookup word to determine whether or not a hit results, wherein the hit is determined if an entry of said content-addressable memory entries matches the lookup word in all or all but k bit positions, wherein n and k are integers, n>k, and k>0.

One embodiment identifies a position of the matching entry. In one embodiment, the lookup word includes an original lookup value and a lookup word error-correcting or error-detecting code generated based on the original lookup value. One embodiment identifies whether a determined hit is a full hit (all bits matched) or a partial hit (all but k bits matched). In one embodiment, k is less than or equal to the result of the integer division of (n/2) when n is an odd number and k is less than the result of the integer division of (n/2) when n is an even number. In one embodiment, in response to determining that there was a partial hit, a lookup operation is performed in a second data structure to verify the hit result. In one embodiment, in response to determining that there was a partial hit, the partially matching entry is updated to remove the any bit errors in the entry.

One embodiment for identifying matching values in a content-addressable memory determines a set of extended values based on an original set of values, with each of the extended values including its original value and an error-correcting or error-detecting code generated based on the original value, such that each of the extended values are guaranteed to differ from each other by at least three bits. Content-addressable memory entries are programmed with the extended values. Lookup operations are then performed on the content-addressable memory entries based on a lookup word to determine whether or not a hit results, with a hit being determined if an entry matches the lookup word in all or all but one bit positions. One embodiment also determines a hit if an entry matches the lookup word in all but two bit positions. One embodiment identifies a position of a matching entry. In one embodiment, the lookup word includes an original lookup value and a lookup word error-correcting or error-detecting code generated based on the original lookup value. One embodiment identifies whether a determined hit is a full hit or a partial hit.

FIG. 1A is a block diagram illustrating the generating of extended values/CAM entries including its original value and an error-correcting or error-detecting code generated based on the original value performed in one embodiment. An original value 100 (e.g., one normally stored in a CAM entry) is identified. An extended value/CAM entry 110 is generated to include original value 110 (e.g., in original value field 111) and the error code portion 112 generated by error-correcting or error-detecting code generator 105 (stored in error code field 112). Note, the format of extended value/CAM entry 110 is extensible and can an vary among embodiments. For example, fields 111 and 112 might be in a different order and/or bits from each of the fields 111 and 112 interleaved.

Also, there are many well-known error-correcting and/or error-detecting code generation mechanisms, and thus these will not be discussed in detail. Embodiments are extensible and are not limited to any particular known or to be developed error-correcting or error-detecting code generation algorithm or mechanism. Rather, embodiments leverage these various techniques to match the needs of the operating environment and application. For example, if bit error rates are low, then an error-correcting and/or error-detecting code generation mechanism with a small Hamming distance will typically be sufficient. In environments with a higher bit error rate, an error-correcting and/or error-detecting code generation mechanism with a larger Hamming distance will typically be used. Also, one embodiment updates or refreshes CAM entries periodically, so the selection of the error-correcting and/or error-detecting code generation mechanism will typically take into consideration the bit error generation rate and this refresh rate.

Also, this Hamming distance determines a maximum number of differences in bits that will be interpreted as a match. For example, with a Hamming distance of three, one embodiment identifies an entry as matching if there are zero or one bit differences between the entry and the lookup word.

Typically, if all entries are guaranteed to be different by n bits, whether due to adding error code portions to original values or simply the original values themselves (e.g., without being supplemented with error code portions), then up to k bit differences can be determined to be considered as a match, where n and k are integers, $n>k$, and $k>0$. Note, the difference between n and k might vary among embodiments, and can range from one to $n-1$. Typically, embodiments use a value of k less than $n/2$, so that a single partially matching entry will be identified. If a value of k greater than or equal to $n/2$ is used and the entries actually vary in distance by n bits, then there could be a corrupted entry that matches in all but k bits and there could also be a corrupted entry that matches by n-k bits (which would be closer to the original lookup word). One embodiment uses a value for k much smaller than $n/2$, such as $k=1$ or $k=2$, to limit the number of corrupted bits which will result is a hit (e.g., a partial hit). One embodiment also determines whether or not there was a suspected hit (e.g., not all bits matched and more than k bits differing, but less than $n/2$ bits differing), so that this entry can be corrected by software or by some other mechanism if needed (e.g., the entry is corrupted).

Note, when integer division is used, the value of k less than $n/2$ (non-integer division) is equivalent to k being less than or equal to the result of the integer division of $(n/2)$ when n is an odd number and k being less than the result of the integer division of $(n/2)$ when n is an even number.

One embodiment, in response to identifying a matching corrupted entry within the range employed by the embodiment, performs another lookup operation in a second data structure, either based on the lookup word or on the matching entry or its identified position in the CAM entries, to verify that the corrupted entry corresponds to an entry that matches the lookup word and/or to acquire the correct value of the entry so that it can update the entry with the correct value to remove the bit errors.

Figure 1B:
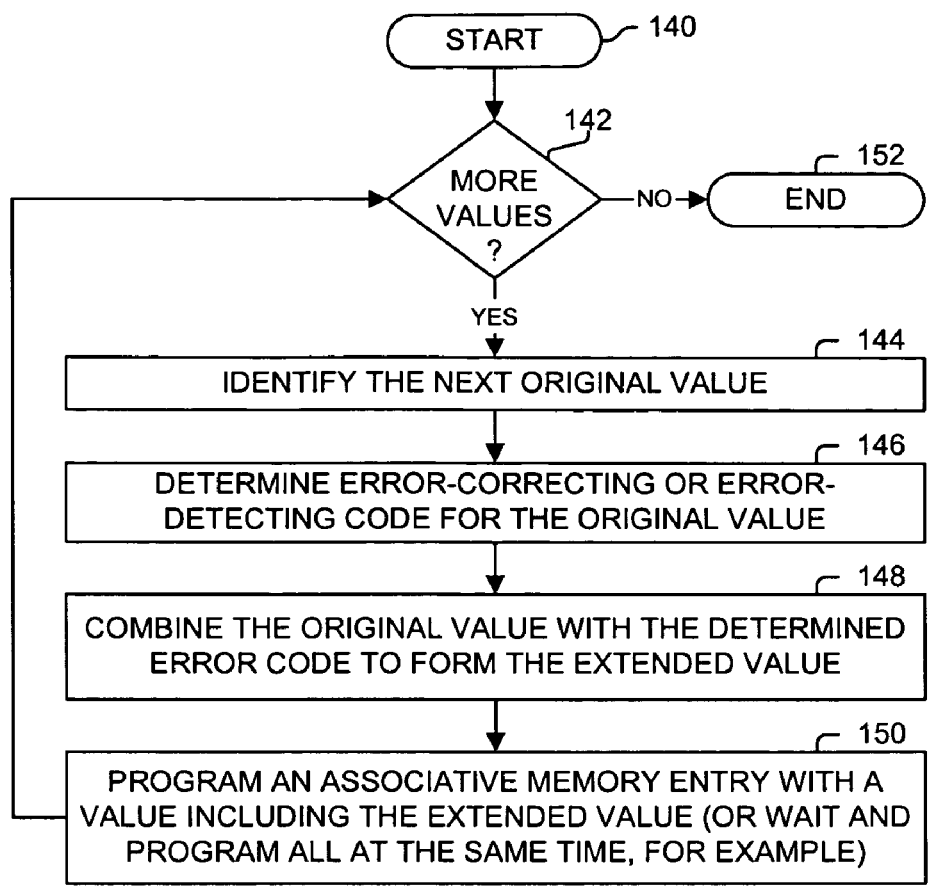
FIG. 1B is a flow diagram illustrating a process used in one embodiment for generating of extended values/CAM entries including its original value and an error-correcting or error-detecting code generated based on the original value performed in one embodiment.
Figure 1C:
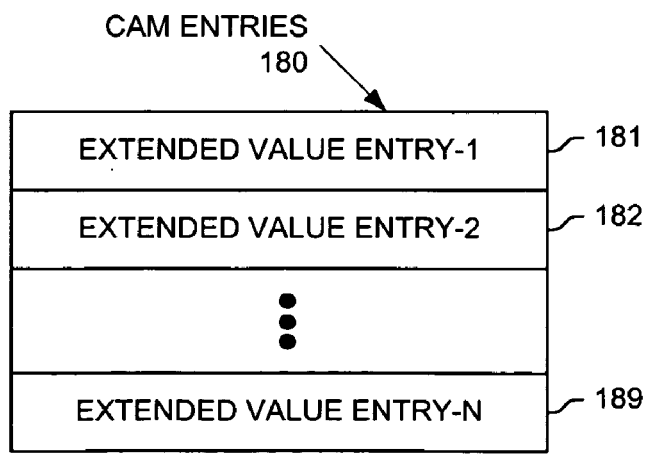
FIG. 1C is a block diagram illustrating exemplary programmed CAM entries in one or more content addressable memories.

FIG. 1B is a flow diagram illustrating a process used in one embodiment for generating of extended values/CAM entries including its original value and an error-correcting or error-detecting code generated based on the original value performed in one embodiment. Processing begins with process block 140, and proceeds to process block 142. While there are more values to extend, then the next original value is identified in process block 144; an error-correction or error-detection code is generated based on the original value in process block 146; the original value and the error code are combined in some manner to create the extended value in process block 148; and the extended value is programmed into a CAM entry (e.g., an extended CAM entry) in process block 150. Note, one embodiment performs blocks 144-148 for all original values, and then subsequently programs the CAM entries in succession or in some other manner. For example, FIG. 1C illustrates these extended values 181-189 programmed in CAM entries 180. When all extended values have been generated and extended entries programmed, then processing is complete as indicated by process block 152.

Figure 2A:
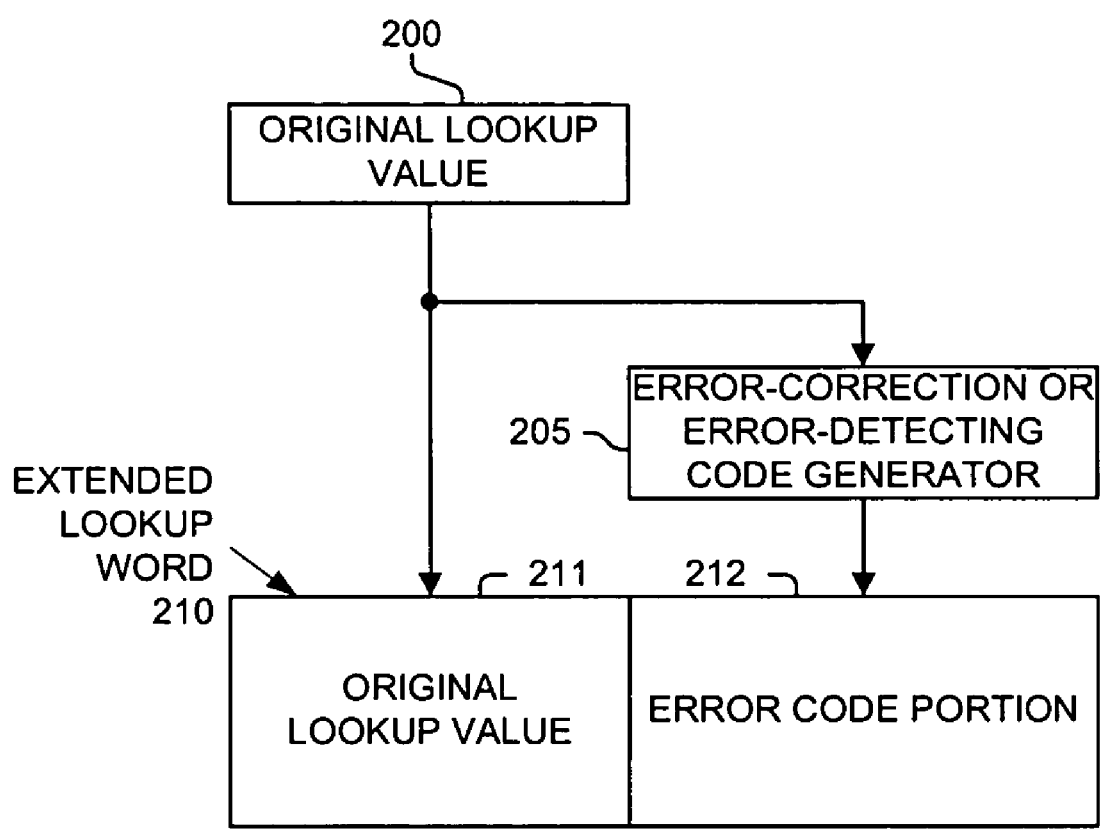
FIG. 2A is a block diagram illustrating the generating of an extended lookup word including its original lookup value and an error-correcting or error-detecting code generated based on the original lookup value performed in one embodiment.

FIG. 2A is a block diagram illustrating the generating of an extended lookup word including its original lookup value and an error-correcting or error-detecting code generated based on the original lookup value performed in one embodiment. An original lookup value 200 (e.g., one normally used as for a lookup operation in a CAM) is identified. An extended lookup word 210 is generated to include original lookup value 200 (e.g., in original lookup value field 211) and the error code portion 212 generated by error-correcting or error-detecting code generator 205 (stored in error code field 212). Note, the format of extended lookup word 210 is extensible and can an vary among embodiments. For example, fields 211 and 212 might be in a different order and/or bits from each of the fields 211 and 212 interleaved.

Figure 2B:
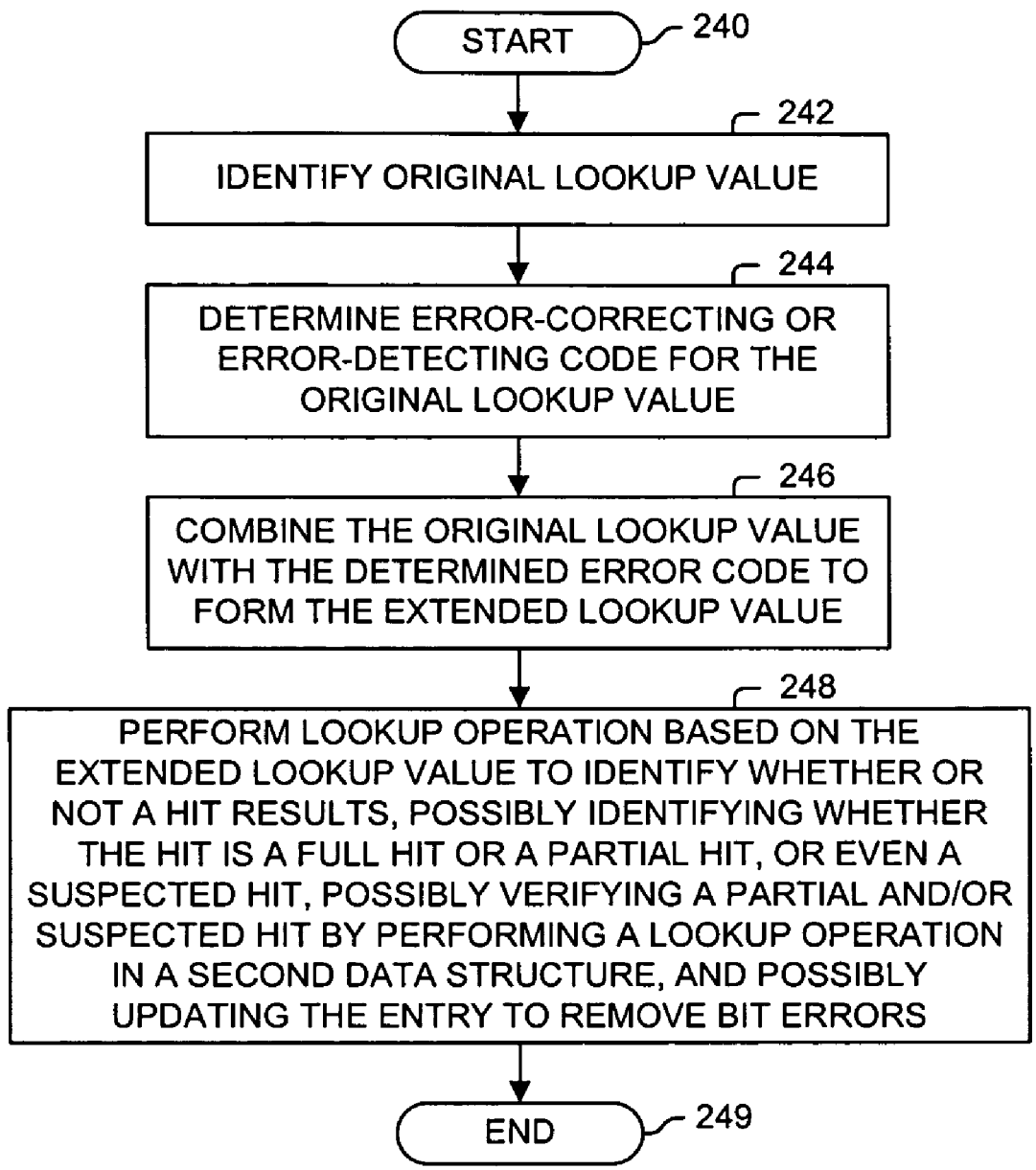
FIG. 2B is a flow diagram illustrating a process used in one embodiment for generating of an extended lookup word including its original lookup value and an error-correcting or error-detecting code generated based on the original lookup value performed in one embodiment.

FIG. 2B is a flow diagram illustrating a process used in one embodiment for generating of an extended lookup word including its original lookup value and an error-correcting or error-detecting code generated based on the original lookup value performed in one embodiment. Processing begins with process block 240, and proceeds to process block 242, wherein an original lookup value is identified. In process block 244, an error-correction or error-detection code is generated based on the original lookup value. In process block 246, the original lookup value and the error code are combined in some manner to create the extended lookup value (i.e., in a manner consistent with the creation of the extended CAM entries).

In process block 248, the a lookup operation is performed on the extended CAM entries based on the extended lookup value to indicate whether or not a hit results, typically along with an identification of the matching extended CAM entry. One embodiment also indicates whether or not the hit was a complete hit (e.g., all bits matched) or a partial hit (e.g., less than all bits matched but within the predetermined number of bits required to be considered a partial hit). One embodiment also indicates whether or not there was a suspected hit (e.g., not all bits matched and more than k bits differing, but less than $n/2$ bits differing). In one embodiment, in response to a partial or suspected hit, the corresponding CAM entry is updated to correct any bit errors. In one embodiment, in response to a partial or suspected hit, a lookup operation is performed on a second data structure, (e.g., the one used in generating the CAM entries or a different one), to confirm whether or not whether an entry was actually matched. In one embodiment, in response to a partial or suspected hit, the entry is updated to remove any bit errors. Processing is complete as indicated by process block 249.

Figure 3A:
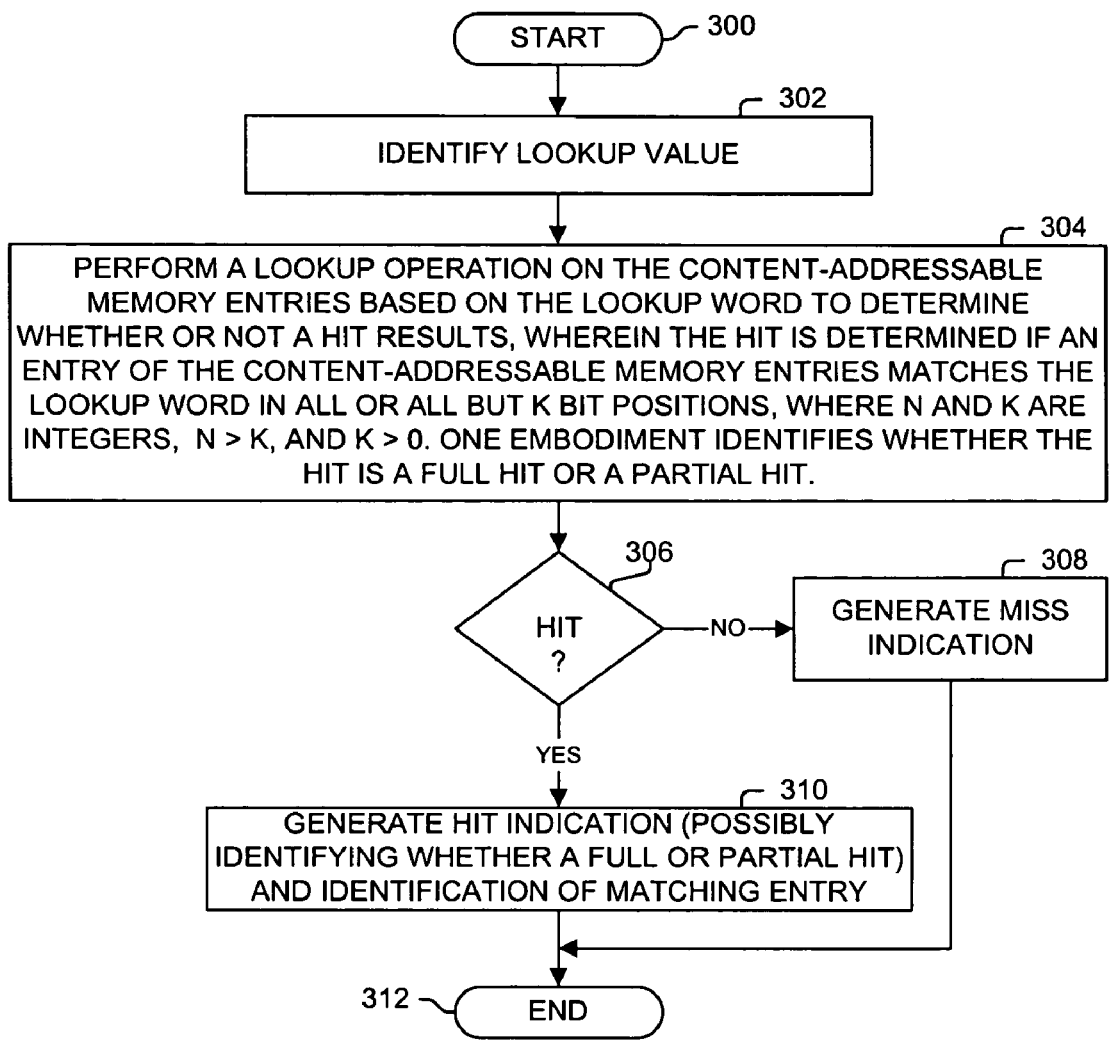
FIG. 3A is a flow diagram illustrating a process used in one embodiment for performing a lookup operation on a set of extended CAM entries based on a lookup word.

FIG. 3A is a flow diagram illustrating a process used in one embodiment for performing a lookup operation on a set of extended CAM entries based on a lookup word. Processing begins with process block 300, and proceeds to process block 302, wherein a lookup value is identified. In process block 304, a lookup operation is performed on the CAM entries based on the lookup word to determine whether or not a hit results, wherein the hit is determined if an entry of said content-addressable memory entries matches the lookup word in all or all but k bit positions, wherein n and k are integers, n>k, and k>0. One embodiment discriminates between whether a determined hit is a full hit (all bits matched) or a partial hit (all but k bits matched). As determined in process block 306, if a hit result was determined, then in process block 310, one or more hit indications are generated to identify the hit. One embodiment signals whether the hit was a full hit or a partial hit. Otherwise, in process block 308, a miss indication is generated. Processing is complete as indicated by process block 312.

Figure 3B:
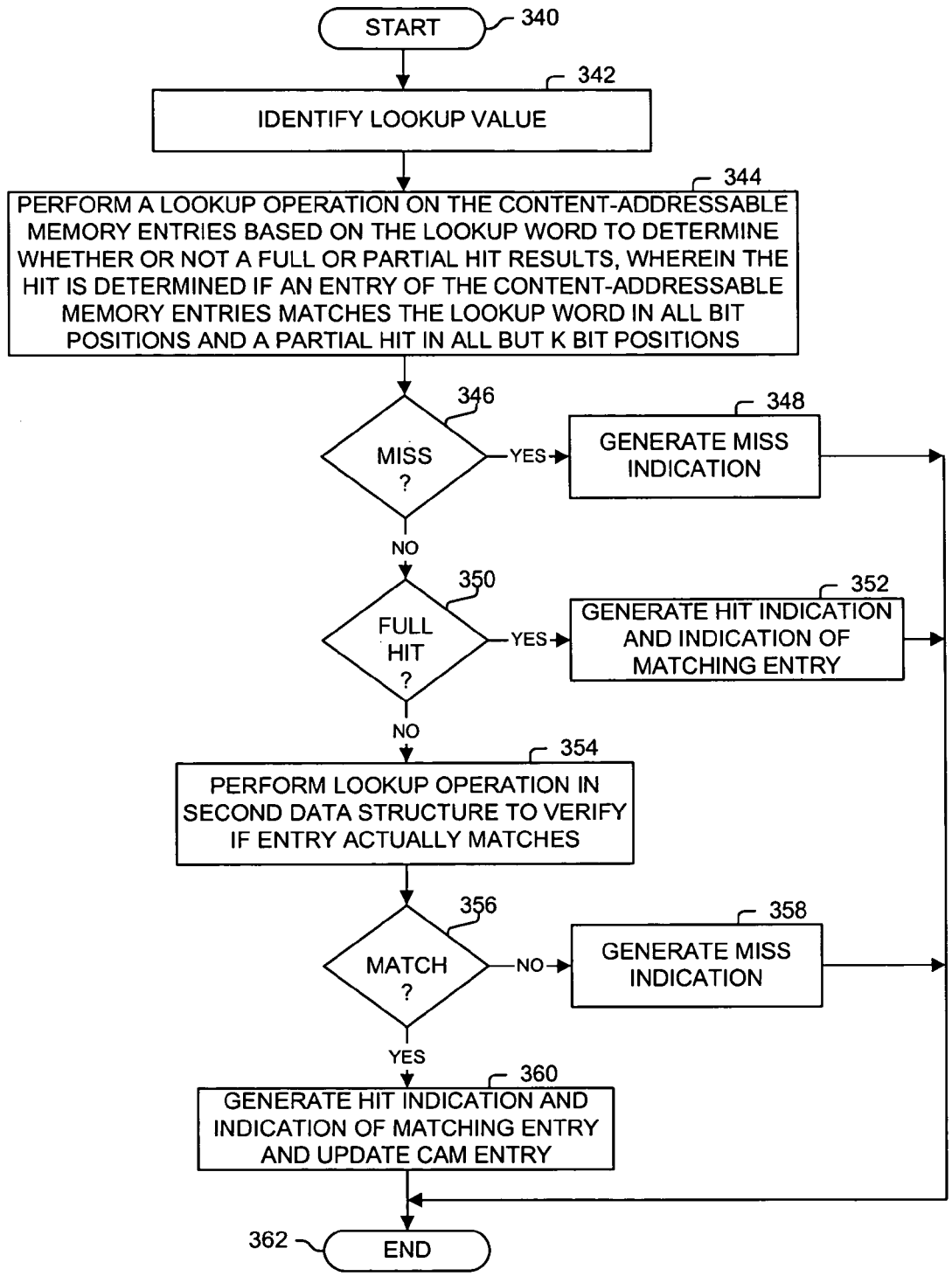
FIG. 3B is a flow diagram illustrating a process used in one embodiment for performing a lookup operation on a set of extended CAM entries based on a lookup word.

FIG. 3B is a flow diagram illustrating a process used in one embodiment for performing a lookup operation on a set of extended CAM entries based on a lookup word. Processing begins with process block 340, and proceeds to process block 342, wherein a lookup value is identified. In process block 344, a lookup operation is performed on the CAM entries based on the lookup word to determine whether or not a full or partial hit results, wherein a full hit is determined if an entry of said content-addressable memory entries matches the lookup word in all bit positions and a partial hit results if an entry matches the lookup word in all but k bit positions, wherein n and k are integers, n>k, and k>0.

As determined in process block 346, if a miss result (e.g., not a full or partial hit) was determined, then in process block 348, one or more miss indications are generated to identify the miss. As determined in process block 350, if a full hit result was determined, then in process block 352, one or more hit or full hit indications are generated to identify the hit, typically including indicating the position of the matching entry. Otherwise, in process block 354, a lookup operation is performed on a second data structure to verify that the identified partially matching entry actually matches the lookup value. For example, a second data structure might include an array in memory of entries corresponding to the non-corrupted entries stored in the CAM. Using the identified position of the partially matching entry, the correct entry value can be retrieved from the second data structure. As determined in process block 356, if the uncorrupted value of the entry does not match the lookup word, then in process block 358, one or more miss indications are generated to identify the miss. Otherwise, in process block 360, one or more hit or partial hit indications are generated to identify the hit, typically including indicating the position of the matching entry. In one embodiment, the matching CAM entry is also updated to remove the bit errors (e.g., by overwriting the corrupted CAM entry with the correct entry value). Processing is complete as indicated by process block 362.

Note, as one skilled in the art would readily understand, there are many different possible ways of signaling between a hit or not a hit (i.e., a miss) and among a partial hit, full hit or no hit (i.e., miss), such as, but not limited to using a signal line or signaling bit for each possible result or encoding the information on possibly fewer signal lines. For example, one embodiment uses a single line or bit to identify whether there was a hit or no hit. One embodiment uses an additional line to identify if there was a hit, whether the hit was a full or partial hit. One embodiment encodes these signals on one or more lines or in on or more bits. For example: 00=no hit, 01=partial hit, 10=full hit (and an indication of either hit can be generated using an OR operation on these encoded signals or values).

Figure 4A:
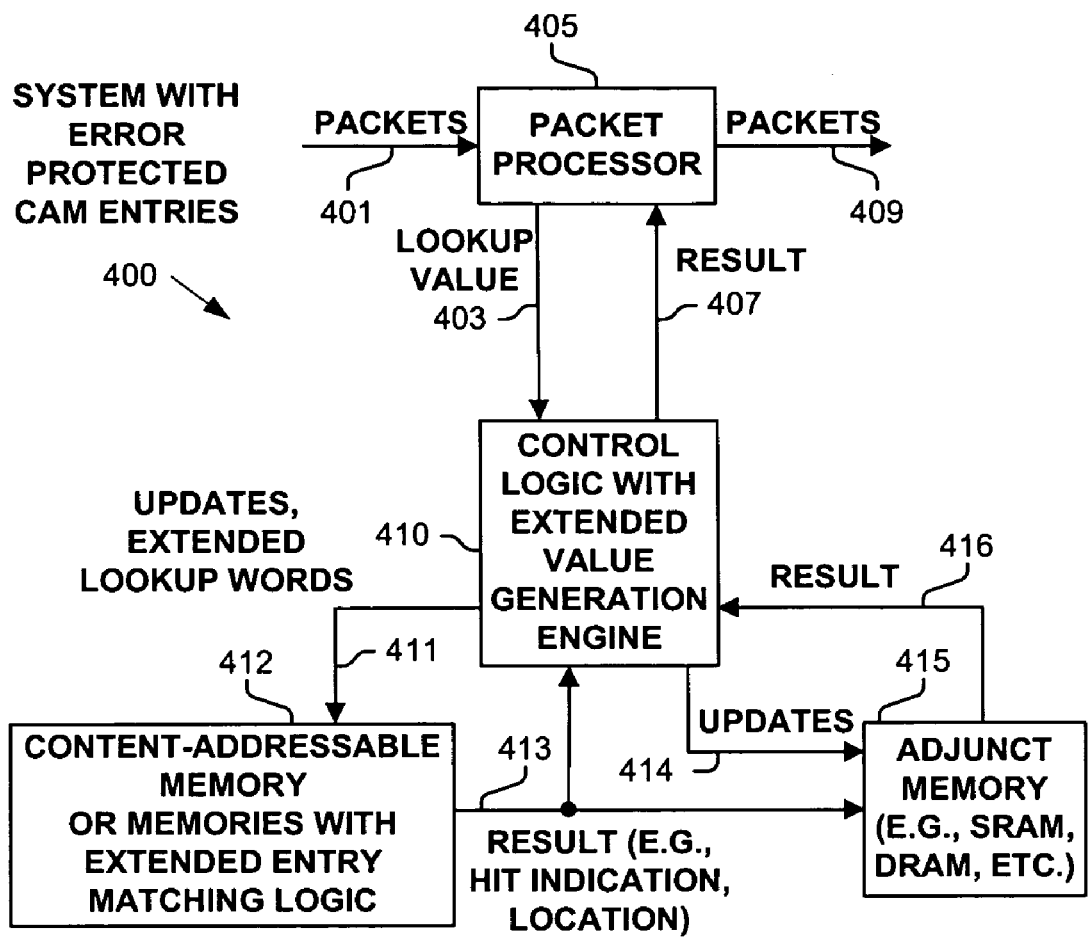
FIG. 4A is a block diagram illustrating an embodiment that generates extended CAM entries and programs a CAM with extended entry matching logic and performs lookup operations thereon using generated extended lookup values.

FIG. 4A illustrates a system 400 using error protected CAM entries. that generates extended CAM entries and programs a CAM with extended entry matching logic and performs lookup operations thereon using generated extended lookup values. System 400 may be, for example, part of a router, communications, computer or any other system or component.

In one embodiment, control logic 410 generates extended entries, programs, updates, generates extended lookup values and performs lookup operations on associative memory or memories 412 by providing updates and extended lookup words 411. In one embodiment, control logic 410 includes custom circuitry, such as, but not limited to discrete circuitry, ASICs, memory devices, processors, etc. Control logic 410 also typically stores indications of desired actions to be taken via updates 414 in adjunct memory or memories 415. In one embodiment, control logic 410 includes a memory for storing a second data structure of the original, uncorrupted CAM entries for use in verifying a partial match and/or for updated corrupted CAM entries.

A hit result 413 (e.g., whether or not there was a hit, and possibly whether the hit was a full or partial hit) is typically provided to control logic 410 and to adjunct memory or memories 415, which produces result 416. In one embodiment, a single chip or ASIC contains system 400. In one embodiment, a single chip or ASIC contains system 400 except for packet processor 405. In one embodiment, less than all or even no two components of system 400 reside on the same chip or ASIC.

In one embodiment, packets 401 are received by packet processor 405. In addition to other operations (e.g., packet routing, security, etc.), packet processor 405 typically generates lookup value 403 (either an original or extended lookup value) which is provided to control logic 410, which generates the extended lookup value 411 if required, and initiates one or more CAM lookup operations on content-addressable memory or memories 412. A result 407 (e.g., a packet classification identification or action) is typically returned to packet processor 405, and in response, one or more of the received packets are manipulated and forwarded as indicated by packets 409.

Figure 4B:
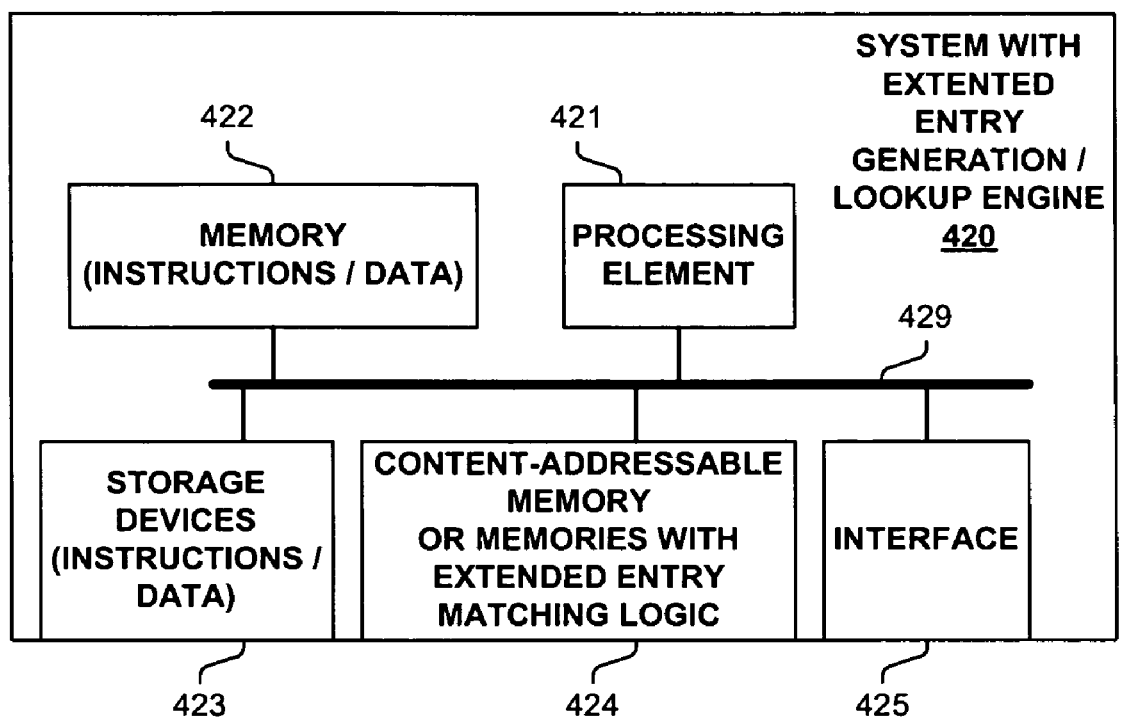
FIG. 4B is a block illustrating a system or component used in one embodiment that generates extended CAM entries and programs a CAM with extended entry matching logic and performs lookup operations thereon using generated extended lookup values.

FIG. 4B is a block illustrating a system or component used in one embodiment for generating and/or programming an associative memory with extended entries and/or performing lookup operations thereon using generated extended lookup values. System 420 may be part of a router, communications, computer or any other system or component. In one embodiment, system 420 performs one or more processes corresponding to one of the diagrams illustrated herein or otherwise described herein.

In one embodiment, system 420 includes a processing element 421, memory 422, storage devices 423, one or more content-addressable memories with extended entry matching logic 424, and an interface 425 for connecting to other devices, which are coupled via one or more communications mechanisms 429 (shown as a bus for illustrative purposes).

Various embodiments of system 420 may include more or less elements. The operation of system 420 is typically controlled by processing element 421 using memory 422 and storage devices 423 to perform one or more tasks or processes, such as programming and performing extended lookup operations using content-addressable memory or memories 424. Memory 422 is one type of computer readable media, and typically comprises random access memory (RAM), read only memory (ROM), flash memory, integrated circuits, and/or other memory components. Memory 422 typically stores computer executable instructions to be executed by processing element 421 and/or data which is manipulated by processing element 421 for implementing functionality in accordance with one embodiment of the invention. Storage devices 423 are another type of computer readable media, and typically comprise solid state storage media, disk drives, diskettes, networked services, tape drives, and other storage devices. Storage devices 423 typically store computer executable instructions to be executed by processing element 421 and/or data which is manipulated by processing element 421 for implementing functionality in accordance with one embodiment of the invention.

In one embodiment, processing element 421 provides control and data information (e.g., lookup words, modification data, profile IDs, etc.) to content-addressable memory or memories 424, which perform lookup operations to generate lookup results and possibly error indications, which are received and used by processing element 421 and/or communicated to other devices via interface 425.

Figure 5:
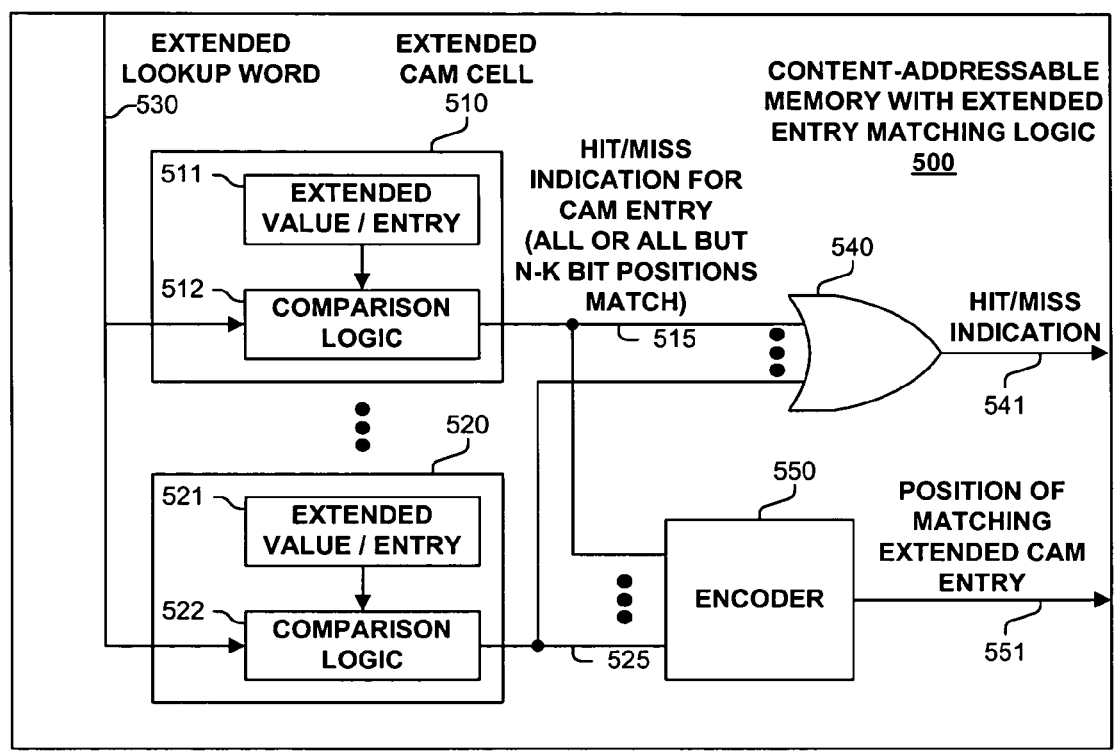
FIG. 5 is a block diagram illustrating one embodiment of a CAM with extended entry matching logic.

FIG. 5 illustrates a CAM 500, which includes extended entry matching logic to determine whether or not a hit results (e.g., a full or a partial hit). Note, as used in this document, the term "extended" refers to those values etc. actually extended to include an error-correcting or error-detecting value to guarantee an appropriate Hamming distance, as well as those values natively having an appropriate distance without having to add any additional field or value. Typically, information is not guaranteed to provide such distance, so for ease of reader understanding, this term is typically used.

As shown, CAM 500 includes extended CAM cells 510 and 520 which store the values to be matched (511 and 522) against lookup word 520 by comparison logic (512 and 522) to generate indications of whether or not a hit (i.e. a full or partial hit) results for each extended CAM cell (510 and 520). If a hit is identified by a high value, then OR gate 540 can be used to identify based on results 515 and 525 whether a hit resulted (high) or no hit resulted (low—i.e., a miss) 541. Encoder 550 (possibly a priority encoder) is used to identify (551) the position of the matching (i.e., full or partial hit) entry (e.g., which CAM cell 510, 520 matched). Note, one embodiment extends the notification of whether or not a hit results by signaling an indication of whether or not it was a full or a partial hit.

Comparison logic 512, 522 may vary among embodiments. For example, in one embodiment, comparison logic 512, 522 includes a processing element. In one embodiment, comparison logic 512, 522 includes discrete logic. In one embodiment, comparison logic 512, 522 includes logic to exclusively-OR or one-bit sum each of the corresponding bits of the lookup word 530 and corresponding stored value (511, 521) in the CAM cell (510, 520), with these results each summed to identify the number of different bit positions between the lookup word 530 and corresponding stored value (511, 521). One or more comparison operations can be performed to identify a hit (i.e., the sum is less than or equal to k) or individually a full hit (i.e., the sum is zero) and a partial hit (i.e., the sum is greater than zero and is less than or equal to k). One embodiment, determines and provides external indications of whether a determined hit was a full hit or a partial hit.

Figure 6A:
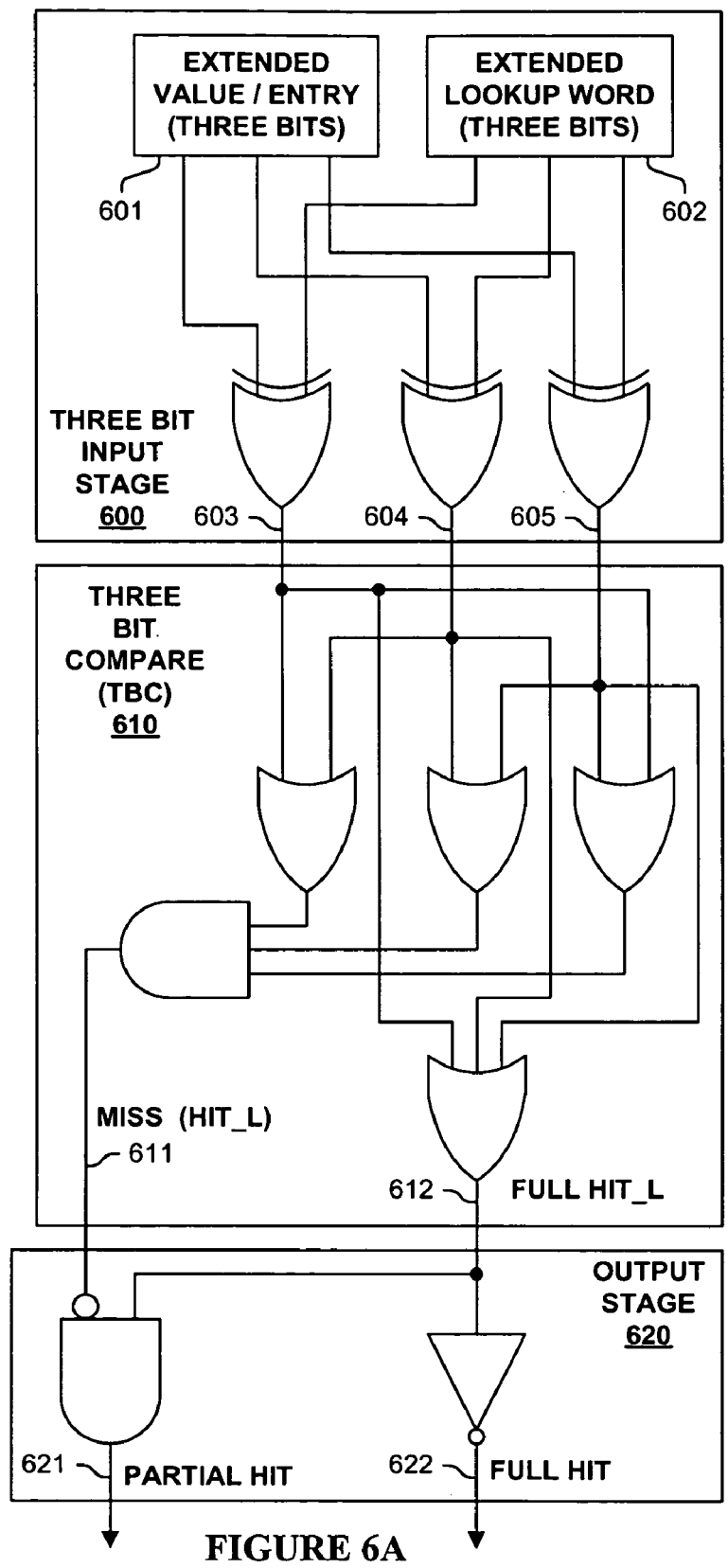
FIG. 6A is a block diagram illustrating circuitry used in one embodiment of a CAM with extended entry matching logic for use in identifying whether or not three bits of an extended lookup word match all or all but one bit of a three-bit extended CAM entry.
Figure 6B:
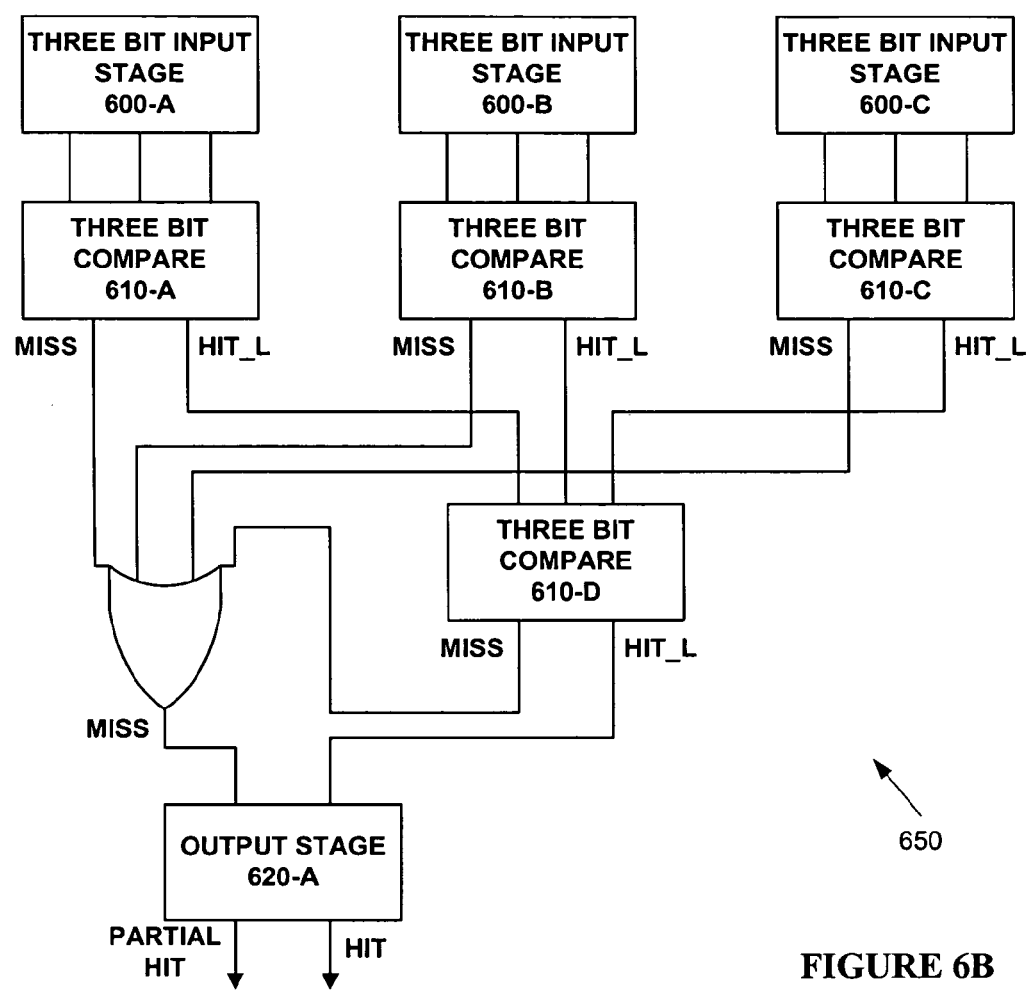
FIG. 6B is a block diagram illustrating circuitry used in one embodiment of a CAM with extended entry matching logic for use in identifying whether or not nine bits of an extended lookup word match all or all but one bit of a nine-bit extended CAM entry.
Figure 6C:
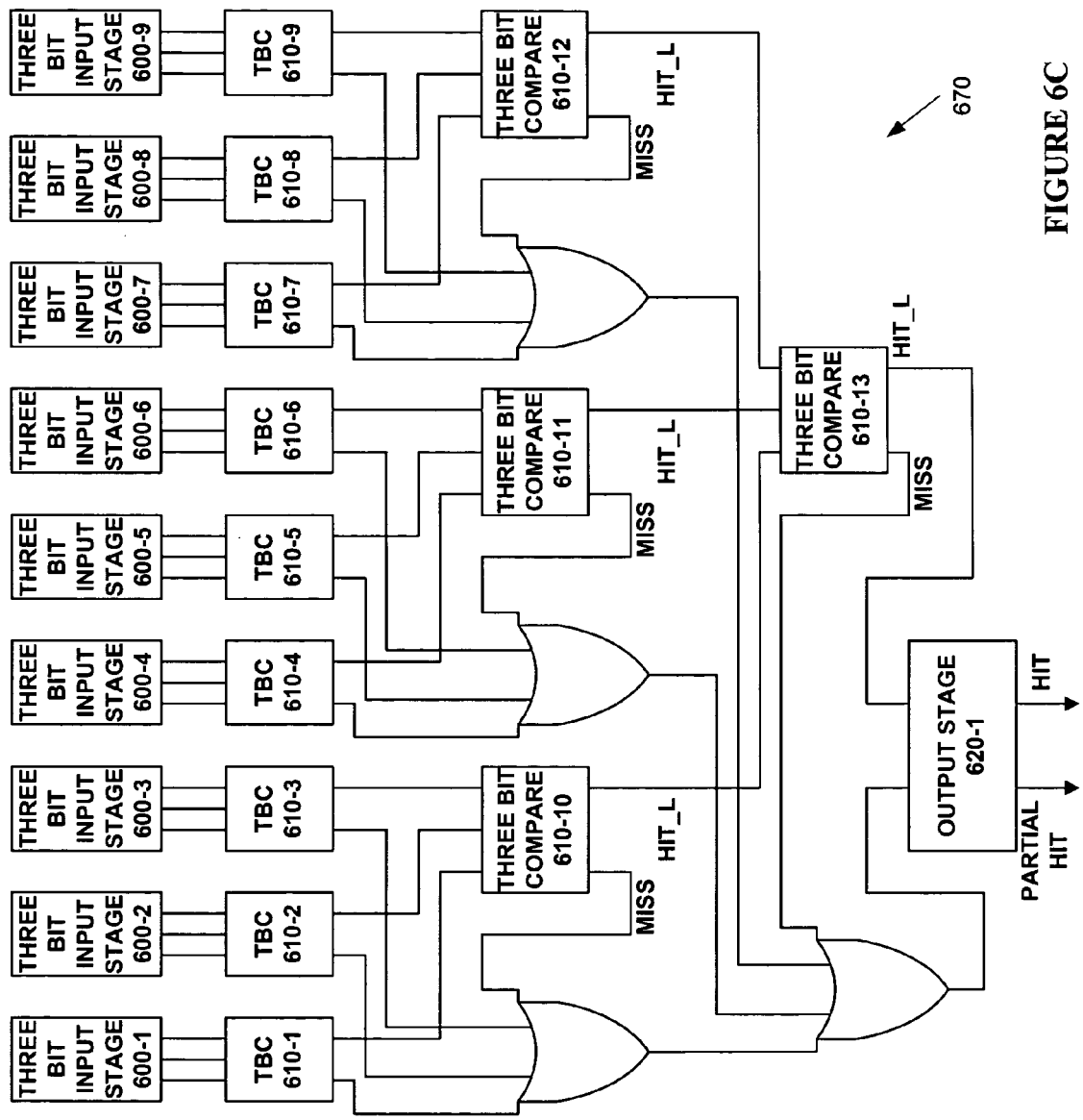
FIG. 6C is a block diagram illustrating circuitry used in one embodiment of a CAM with extended entry matching logic for use in identifying whether or not twenty-seven bits of an extended lookup word match all or all but one bit of a twenty-seven-bit extended CAM entry.

FIGS. 6A-C illustrate a modular way to identify whether or not there is a full or partial match, with k being equal to one. In other words, whether or not there is a full match (no bits differ) or a partial match (one bit position differs between a lookup word and the entire CAM entry). FIG. 6A illustrates building blocks and a configuration for use with three bit lookup words and CAM entries. FIG. 6B uses these building blocks and illustrates a configuration for use with nine bit lookup words and CAM entries. FIG. 6C uses some of these building blocks and illustrates a configuration for use with nine bit lookup words and CAM entries.

FIG. 6A illustrates circuitry used in a CAM with extended entry matching logic for use in identifying whether or not three bits of an extended lookup word match all or all but one bit of a three-bit extended CAM entry. Three bit input stage 600 includes the 3-bit value 601 of the stored entry and receives the 3-bit value 602 of the lookup word, and provides signals 603-605 whether the corresponding bits match. Three bit compare (TBC) circuitry 610 then uses OR and AND gates as shown to generate a MISS signal 611 (i.e., high if two or more bits differ, else low—i.e., low if a full or partial hit) and a HIT_L signal 612 (i.e., low if all bits match, else high). Output stage 620 generates a full hit signal 622 (i.e., high if a full hit, else low) and a partial hit signal 621 (i.e., high if a partial hit, else low). Thus, in order to identify whether there was a hit (i.e., either a full or partial hit), either the inverted value of MISS (HIT_L) signal 611 or the output of an OR gate OR'ing signals 621 and 622 can be used.

FIG. 6B illustrates circuitry 650 used in a CAM with extended entry matching logic for use in identifying whether or not nine bits of an extended lookup word match all or all but one bit of a three-bit extended CAM entry. Three three-bit input stages 600 (FIG. 6A), four three bit compares (TBCs) 610 (FIG. 6A), and one output stage 620 (FIG. 6A) are used and interconnected as shown.

FIG. 6C illustrates circuitry 670 used in a CAM with extended entry matching logic for use in identifying whether or not twenty-seven bits of an extended lookup word match all or all but one bit of a three-bit extended CAM entry. Nine three-bit input stages 600 (FIG. 6A), thirteen three bit compares (TBCs) 610 (FIG. 6A), and one output stage 620 (FIG. 6A) are used and interconnected as shown.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. A method for identifying matching values in a content-addressable memory, the method comprising:

determining a plurality of extended values based on a plurality of values, each of the plurality of extended values including a particular value of the plurality of values and an error-correcting or error-detecting code generated based on the particular value, wherein each of the plurality of extended values are guaranteed to differ from each other by at least n bits;

programming a plurality of content-addressable memory entries with the plurality of extended values; and performing a lookup operation on said content-addressable memory entries based on a lookup word to determine whether or not a hit results, wherein the hit is determined if an entry of said content-addressable memory entries matches the lookup word in all bit positions except for up to a maximum of k bit positions;

wherein n and k are integers, n>k, and k>0.

2. The method of claim 1, wherein k is less than or equal to the result of the integer division of (n/2) when n is an odd number and k is less than the result of the integer division of(n/2) when n is an even number.

3. The method of claim 1, comprising identifying a position of the entry in said content-addressable entries if the hit is determined for the entry.

4. The method of claim 1, wherein the lookup word includes an original lookup value and a lookup word error-correcting or error-detecting code generated based on the original lookup value.

5. The method of claim 1, wherein said determining whether or not a hit results includes discriminating between a full and a partial hit, wherein the full hit corresponds to the entry matching the lookup word in all bit positions, and the partial hit corresponds to the entry not matching in all bit positions and the entry matching the lookup word in all bit positions except for up to a maximum of k bit positions.

6. The method of claim 5, comprising in response to said determining the partial hit, performing a lookup operation in a second data structure to verify the hit result.

7. The method of claim 6, comprising in response to said determining the partial hit, updating the entry.

8. The method of claim 5, comprising in response to said determining the partial hit, updating the entry.

9. The method of claim 5, wherein k is less than or equal to the result of the integer division of (n/2) when n is an odd number and k is less than the result of the integer division of (n/2) when n is an even number.

10. A method for identifying matching values in a content-addressable memory, the method comprising:

determining a plurality of extended values based on a plurality of values, each of the plurality of extended values including a particular value of the plurality of values and an error-correcting or error-detecting code determined based on the particular value, wherein each of the plurality of extended values are guaranteed to differ from each other by at least three bits;

programming a plurality of content-addressable memory entries with the plurality of extended values; and performing a lookup operation on said binary content-addressable memory entries based on a lookup word to determine whether or not a hit results, wherein the hit is determined if an entry of said binary content-addressable memory entries matches the lookup word in all bit positions and the hit is also determined if said entry matches the lookup word in all bit positions but one bit position.

11. The method of claim 10, wherein said determining whether or not a hit results includes discriminating between a full and a partial hit, wherein the full hit corresponds to the entry matching the lookup word in all bit positions, and the partial hit corresponds to the entry matching the lookup word in all but one bit positions.

12. The method of claim 11, comprising in response to said determining the partial hit, performing a lookup operation in a second data structure to verify the hit result.

13. The method of claim 11, comprising in response to said determining the partial hit, updating the entry.

14. The method of claim 10, wherein the hit is also determined if the entry of said content-addressable memory entries matches the lookup word in all but two bit positions.

15. The method of claim 14, wherein said determining whether or not a hit results includes discriminating between a full and a partial hit, wherein the full hit corresponds to the entry matching the lookup word in all bit positions, and the partial hit corresponds to the entry matching the lookup word in all but one or two bit positions.

16. The method of claim 15, comprising in response to said determining the partial hit, performing a lookup operation in a second data structure to verify the hit result.

17. The method of claim 15, comprising in response to said determining the partial hit, updating the entry.

18. The method of claim 10, wherein the lookup word includes an original lookup value and a lookup word error-correcting or error-detecting code generated based on the original lookup value.

19. An apparatus for identifying matching values in a content-addressable memory, the apparatus comprising:

means for determining a plurality of extended values based on a plurality of values, each of the plurality of extended values including a particular value of the plurality of values and an error-correcting or error-detecting code determined based on the particular value, wherein each of the plurality of extended values are guaranteed to differ from each other by at least n bits;

means for programming a plurality of content-addressable memory entries with the plurality of extended values; and means for performing a lookup operation on said content-addressable memory entries based on a lookup word to determine whether or not a hit results, wherein the hit is determined if an entry of said content-addressable memory entries matches the lookup word in all bit positions except for up to a maximum of k bit positions;

wherein n and k are integers, n>k, and k>0.

20. The apparatus of claim 19, wherein Ic is less than or equal to the result of the integer division of (n/2) when n is an odd number and k is less than the result of the integer division of (n/2) when n is an even number.

21. The apparatus of claim 19, including means for generating the lookup word, the lookup word including an original lookup value and a lookup word error-correcting or error-detecting code generated based on the original lookup value.

22. The apparatus of claim 19, wherein said determining whether or not a hit results includes discriminating between a frill and a partial hit, wherein the full hit corresponds to the entry matching the lookup word in all bit positions, and the partial hit corresponds to the entry not matching in all bit positions and the entry matching the lookup word in all bin bit positions except for up to a maximum of k bit positions.

23. The apparatus of claim 22, comprising means for performing a lookup operation in a second data structure to verify the hit result in response to said determining the partial hit.

24. The apparatus of claim 22, comprising means for updating the entry in response to said determining the partial hit.

25. The apparatus of claim 22, wherein k is less than or equal to the result of the integer division of (n/2) when n is an odd number and k is less than the result of the integer division of(n/2) when n is an even number.

26. An apparatus comprising:

a plurality of content-addressable memory entries;

logic configured to perform a lookup operation on said content-addressable memory entries based on a lookup word to determine whether or not a hit results, wherein the hit is determined if an entry of said content-addressable memory entries matches the lookup word in all bit positions except for up to a maximum of k bit positions;

wherein k is an integer greater than zero.

27. The apparatus of claim 26, wherein said logic is configured to identify a position of the entry in said content-addressable entries if the hit is determined for the entry.

28. The apparatus of claim 26, wherein k=1.

29. The apparatus of claim 26, wherein said determining whether or not a hit results includes discriminating between a full and a partial hit, wherein the full hit corresponds to the entry matching the lookup word in all bit positions, and the partial hit corresponds to the entry not matching in all bit positions and the entry matching the lookup word in all bit positions except for up to a maximum of k bit positions.

30. The apparatus of claim 29, wherein k=1.

* * * * *

UNITED STATES PATENT AND TRADEMARK OFFICE
CERTIFICATE OF CORRECTION

PATENT NO. : 7,290,083 B2  Page 1 of 1
APPLICATION NO. : 10/879254
DATED : October 30, 2007
INVENTOR(S) : Shoham et al.

It is certified that error appears in the above-identified patent and that said Letters Patent is hereby corrected as shown below:

Col. 10, line 8, replace "maimer" with -- manner --

Col. 15, line 9, replace "of(n/2)" with -- of (n/2) --

Col. 16, line 40, replace "Ic" with -- k --

Col. 16, line 52, replace "frill" with -- full --

Col. 16, line 54, replace "all bin bit" with -- all bit --

Signed and Sealed this

Eighth Day of June, 2010

David J. Kappos
*Director of the United States Patent and Trademark Office*